United States Patent [19]

Gray

[11] Patent Number: 4,622,283

[45] Date of Patent: Nov. 11, 1986

[54] DEEP ULTRA-VIOLET LITHOGRAPHIC RESIST COMPOSITION AND PROCESS OF USING

[75] Inventor: Gary M. Gray, Pelham, Ala.

[73] Assignee: J. T. Baker Chemical Company, Phillipsburg, N.J.

[21] Appl. No.: 775,222

[22] Filed: Sep. 12, 1985

Related U.S. Application Data

[63] Continuation-in-part of Ser. No. 539,817, Oct. 7, 1983, abandoned.

[51] Int. Cl.[4] .......................... G03C 1/54; G03C 1/60; G03F 7/26
[52] U.S. Cl. .................................... 430/191; 430/165; 430/192; 430/193; 430/326; 534/556
[58] Field of Search ............... 430/192, 193, 165, 326, 430/191; 534/556

[56] References Cited

U.S. PATENT DOCUMENTS

| | | | |
|---|---|---|---|
| 3,130,048 | 4/1964 | Fritz et al. | 430/193 |
| 4,207,107 | 6/1980 | Ross | 430/193 |
| 4,284,706 | 8/1981 | Clecak et al. | 430/193 |
| 4,339,522 | 7/1982 | Balanson et al. | 430/193 |
| 4,522,911 | 6/1985 | Clecak et al. | 430/193 |

OTHER PUBLICATIONS

Grant, B. D. et al., IEEE Transactions on Electron Devices, vol. ED-28, No. 11, pp. 1300–1305, 11/1981.
Korobitsyna, I. K. et al., *Zh. Org. Khim*, 12, pp. 1245–1260, 1976.
Dinaburg, M. S., "Photosensitive Diazo Cpds.", The Focal Press, pp. 181–182, 1964.

*Primary Examiner*—Charles L. Bowers, Jr.
*Attorney, Agent, or Firm*—George W. Rauchfuss, Jr.

[57] ABSTRACT

Positive deep ultra-violet photoresists which are base developable comprise base soluble polymers and as photosensitive solubilizing agents compounds of the formula

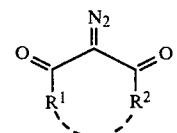

wherein $R^1$ and $R^2$ can each individually be alkyl, aryl, alkoxy alkyl, aralkyl or haloalkyl radicals or $R^1$ and $R^2$ taken together can be an alkylene radical.

16 Claims, No Drawings

DEEP ULTRA-VIOLET LITHOGRAPHIC RESIST COMPOSITION AND PROCESS OF USING

RELATED APPLICATION

This application is a continuation-in-part of my earlier copending patent application Ser. No. 539,817 filed Oct. 7, 1983, now abandoned.

FIELD OF THE INVENTION

This invention relates to deep ultra-violet photoresists compositions containing a resin and photosensitive solubilizing agents and to a process for forming a lithographic resist image employing said compositions.

BACKGROUND OF THE INVENTION

Due to the advancing state of the art in the projection or lithographic printing field, it has become highly desirable to be able to provide image geometries of less than 2 microns and very high device packing densities. In order to most advantageously obtain same, it has become highly desirable that projection imaging wavelengths in the deep ultra-violet (UV) region of below about 300 nm be employed. It is therefore desirable that suitable deep UV resist compositions be available for use with imaging wavelengths in the deep UV region.

Recently U.S. Pat. No. 4,339,522 to R. Balamson et al., issued July 13, 1982 and assigned to International Business Machines Corporation, disclosed such a deep UV resist composition which comprises phenolic-aldehyde resins sensitized with Meldrum's acid diazo or a homologue thereof.

A need exists for other such deep UV resins and especially deep UV resists providing for improved image resolution characteristics. Especially useful would be deep UV resin compositions providing good resolution of 0.75 micron lines or smaller.

SUMMARY OF THE INVENTION

Positive deep UV photoresists which are sensitive to light in the deep UV range of from about 240-300 nm and which are base soluble are provided by resists comprising a base soluble polymer and photosensitive solubilizing agents selected from the group consisting of compounds of the formula

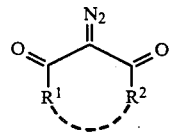

wherein $R^1$ and $R^2$ are individually selected from the group consisting of alkyl, aryl, alkoxyalkyl, aralkyl and haloalkyl radicals or $R^1$ and $R^2$ taken together may be an alkylene radical.

Especially preferred as solubility inhibitors according to this invention are the compounds of the formula wherein $R^1$ and $R^2$ are individually selected from the group consisting of alkyl, aryl, alkoxyalkyl, aralkyl and haloalkyl radicals. Even more preferred are the compounds of the formula wherein $R^1$ and $R^2$ are taken together and is an alkylene radical.

In the compounds of the above formulae the alkyl, aryl, alkoxy alkyl, aralkyl and haloalkyl preferably contain up to 20 carbon atoms, and the alkylene radical preferably contains up to about 20 carbon atoms. Even more preferred are those compounds of the above formulae wherein the alkyl, aryl, alkoxyalkyl, aralkyl and haloalkyl radicals contain up to 10 carbon atoms and still more peferred are those compounds wherein the alkyl, aryl, alkoxyalkyl, aralkyl, haloalkyl and alkylene radicals contain up to 6 carbon atoms. The halo moiety of the haloalkyl radical can be chlorine, fluorine, bromine or iodine but is preferably chlorine or fluorine.

The compounds useful as solubilizing agents according to this invention are either known or can be easily prepared. For example, the $\beta$-diazo-$\alpha$, $\gamma$-diketone compounds of the formula are prepared by reacting any suitable sulfonylazide, such as p-toluenesulfonyl azide (TSA) or naphthylenesulfonyl azide (NSA), with readily available $\alpha,\gamma$-diketones in the presence of a catalyst such as dry triethylamine and any suitable solvent such as ethanol, benzene or acetonitrile and the like according to the following reaction scheme:

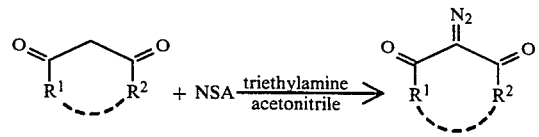

wherein $R^1$ and $R^2$ are as defined hereinbefore. Generally after reacting for a period of about 3 to about 5 hours the reaction mixture is filtered to remove the precipitated sulfonamide and the filtrate is evaporated to dryness. The product may then be partially purified by partitioning between ether and dilute alkali hydroxide. The residues may be purified either by recrystallization, if the product is a solid, or by chromatography, such as flash chromatography on silica gel if the product is an oil.

Exemplary of reactions conducted according to the Reaction Scheme are the following preparations. A mixture of 23.33 g (0.1 mol) of 2-naphthylene-sulfonyl azide, 13.9 ml (0.1 mol) of dry triethylamine and 0.1 mol of the appropriated $\alpha,\gamma$-diketone in 200 ml of dry acetonitrile is stirred at ambient temperature for a period of one to seven days. The reaction mixture is then filtered to remove the precipitated 2-naphthylene sulfonamide and the filtrate is evaporated to dryness. The residue is purified either by recrystallization, if the product is a solid, or by chromatography on silica gel if the product is an oil. Following this procedure the following $\beta$-diazo-$\alpha,\gamma$-diketone compounds of the formula as listed in Table I were prepared.

TABLE I

| $R^1$ | $R^2$ | $^1$H NMR Resonances |
|---|---|---|
| —CH$_2$CH$_2$— | | CH$_2$: $\delta$(ppm) = 2.67s |
| —CH$_2$CH$_2$CH$_2$— | | C—CH$_2$: $\delta$(ppm) = 2.47m; integration = 4 |
| | | CH$_2$: CH$_2$—CH$_2$: $\delta$(ppm) = 2.00m integration = 2 |
| —CH$_2$—C(CH$_3$)$_2$—CH$_2$— | | CH$_2$: $\delta$(ppm) = 2.40s; integration = 2 |
| | | CH$_3$: $\delta$(ppm) = 1.10s; integration = 3 |
| CH$_3$— | phenyl | C$_6$H$_5$: $\delta$(ppm) = 7.47m; integration = 5 |

TABLE I-continued

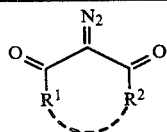

| R¹ | R² | ¹H NMR Resonances |
|---|---|---|
| phenyl | phenyl | $CH_3$: $\delta$(ppm) = 2.50s; integration = 3 $C_6H_5$: $\delta$(ppm) = 7.40m | s = singlet,
d = doublet,
t = triplet,
q = quartet,
sep = septet,
m = multiplet

When the solubilizing agents of this invention are added to base soluble polymers and the resulting photoresist compositions are cast as films on substrates the solubilizing agents increase the solubility of the polymeric film in developer in the area of the film which has been exposed to the deep UV light compared to the area of the polymeric film not exposed to UV light. In the areas of the film exposed to deep UV light the solubilizing agents of this invention increase the solubility of the polymeric film to developers in exposed pattern areas.

Any suitable base soluble photoresist polymer can be employed in the photoresist compositions of this invention, such as the commercially available phenol-formaldehyde resins, cresol-formaldehyde resins poly(-vinylphenol), poly(methyl methacrylatemethacrylic acid) resins and the like. A particularly preferred resin is a poly(methyl methacrylatemethacrylic acid) resin having a methacrylic acid content of between about 20 to 30%, preferably about 25% by weight, having a molecular weight (by gel permeation chromatography) of between about 20,000 to 120,000, preferably about 80,000, and having a narrow polydispersity. Such a resin is one prepared according to the following method. A solution of 4.9 liters of the appropriate amounts of methyl methacrylate and methacrylic acid (a total of 17.5 moles of the two monomers) is stirred under $N_2$ at 80°±2° C. as 300 ml aliquots of a solution of the appropriate amount of 2,2'-diazo bis (2-methylpropionitrile)(3.5 g for a polymer with a molecular weight of 80,000 or 16.5 for a polymer with a molecular weight of 20,000) in 2100 ml of 1,2-dimethoxyethane were added at 30 min. intervals. When the addition is completed, the reaction mixture is stirred at 80°±2° C. for an additional 16 hours before being evaporated to dryness. The residue is washed with 15 liters of dichloromethane for 24 hours and then the wash is decanted and discarded. The insoluble polymer is dissolved in 15 liters of methanol and the solution is filtered. The filtrate is evaporated to dryness to yield the polymeric product.

The photoresist compositions of this invention comprise about 50 to 85% by weight base soluble polymer and from about 15 to about 50% by weight of a solubilizing agent of this invention, preferably about 70% base soluble polymer and about 30% solubilizing agent. The resists may be formed readily by dissolving the polymer and solubilizing agent in a common solvent and casting a film onto an appropriate substrate. Any suitable film-forming solvent may be used, generally film-forming solvents having a boiling point of from about 120° to 210° C., such as for example, diglyme, methyl isobutyl ketone, 2-ethoxyethanol, 2-methoxyethyl acetate, γ-butyrolactone and the like. The resist forming composition will generally comprise from about 50 to about 95% by weight solvent and about 5 to about 50% by weight solid (i.e. base soluble polymer and solubilizing agent combined). Preferably the solvent will comprise about 80 to about 85% by weight and the solids about 15 to 20% by weight. The amount of solids employed will be dependent upon the desired viscosity of the resist forming composition and is such as permits the casting of a resist of about 1 micron thick.

An especially preferred resist composition of this invention comprises about 85% by weight 2-ethoxyethylacetate solvent and about 15% by weight solids which is a mixture of (a) a poly(methyl methacrylate-methacrylic acid) of molecular weight about 80,000 in which the ratio of methyl methacrylate to methacrylic acid is 75/25 and (b) 2-diazo-5,5-dimethylcyclohexane-1,3-dione, wherein the weight ratio of polymer to dione solubilizing agent is 70/30.

The solubilizing agents of this invention produce photoresists of greater resist sensitivity compared to photoresist compositions containing the previously taught Meldrum's acid diazo compounds of U.S. Pat. No. 4,339,522. For example, a photoresist composition containing 2-diazo-5,5-dimethylcyclohexane-1,3-dione requires only one-half the exposure dose (mJ/cm²) to clear an exposed area of photoresist film 1 cm² and having a film thickness of 0.85 microns than does an identical photoresist composition containing an equivalent amount of Meldrum's acid diazo. Exposure of the photoresists was accomplished by projection lithography through a quartz multi-density resilation target using a deep UV exposure system, Perkin Elmer M552-3 in the UV II mode, and images developed using weakly basic aqueous solutions under conditions in which the clearing times of unexposed films of the two formulations were similar.

A lithographic resist composition as described in the second preceding paragraph was prepared and cast as a film onto appropriate wafer substrates and pre-baked at a temperature of from about 56° to about 126° C., preferably from about 56° to about 85° C., for a period of from about 30 to about 45 minutes to drive off most of the solvent and then tested for usefulness as deep UV resists as described in the following procedure.

Using a high-pressure mercury-xenon lamp and a deep-UV filter transmitting from 240–300 nm, three-inch wafers with 150–1050 nm thick resist films were exposed through an opening 70 mm × 150 mm for varying periods of time. Images were formed in the resists after developing for from about 5 to 1200 seconds in an alkaline developer, such as for example, aqueous ammonia solution, aqueous triethanolamine, aqueous ammonium acetate, aqueous tris(hydroxymethyl)aminomethane. Complete removal of resist occurred in those areas exposed to at least 150 mJ/cm² radiation.

A similar experiment was performed using a Perkin Elmer Corporation Micralign 500 projection aligner in the UV II mode to expose the resist coated wafers. Five inch wafers coated with resist at a thickness of 580 nm and prebaked at 95° C. for 45 minutes were employed. No filters were used on the Micralign 500. The exposed wafers were developed for 45 sec. in pH 10 ammonia solution. Five wafers were exposed through an optoline step tablet to determine the best exposure scan setting. Then six wafers were exposed through a meander pattern mask at varying scan settings to measure the sensitivity of the final developed image in the resist to degree of exposure. An exposure scan setting of 14,000 (scan time of about 55 sec.) gave the best image. SEM observations showed 0.75 micrometer lines and spaces were resolved.

I claim:

1. A lithographic resist composition for use with deep UV light of less than 300 nm wavelength, said composition comprising a base soluble film-forming polymer and in admixture therewith as a deep UV sensitizer a sufficient quantity of 2-diazo-5,5-dimethyl-1,3-cyclohexanedione solubilizing agent, whereby upon exposure to deep UV radiation the exposed composition becomes more soluble in alkaline developer.

2. A composition of claim 1 wherein the base-soluble film-forming polymer is a resin selected from the group consisting of phenol-formaldehyde, cresolformaldehyde and poly(methyl methacrylate-methacrylic acid) resins.

3. A composition of claim 1 wherein the solubilizing agent is present in an amount of from about 15 to about 50% by weight based on the combined weight of polymer and agent.

4. A composition of claim 2 wherein the solubilizing agent is present in an amount of from about 15 to about 50% by weight based on the combined weight of polymer and agent.

5. A composition of claim 2 wherein the polymer is a poly(methyl methacrylate-methacrylic acid).

6. A composition of claim 5 wherein the poly (methyl methacrylate-methacrylic acid) has a molecular weight of about 80,000 and the ratio of methyl methacrylate to methacrylic acid is 75/25.

7. A castable resist composition comprising the lithographic resist composition of claim 1 in a film-forming solvent having a boiling point of from about 120° to 210° C.

8. A castable resist composition comprising the lithographic resist composition of claim 4 in a film-forming solvent having a boiling point of from about 120° to 210° C.

9. A castable resist composition of claim 8 wherein the solvent comprises from about 50 to about 95% by weight of the castable composition.

10. A castable resist composition of claim 9 wherein the solvent is selected from the group consisting of diglyme, methyl isobutyl ketone and 2-ethoxyethanol, 2-methoxyethyl acetate and γ-butyrolactone.

11. A castable resist composition comprising the lithographic resist composition of claim 6 in a film-forming solvent having a boiling point of from about 120° to 210° C.

12. A process for forming a lithographic resist image comprising image-wise exposing to deep UV light of less than about 300 nm a film cast on a substrate and dissolving the exposed portion of said film with a basic solution, wherein the film cast on the substrate comprises a film cast from the castable composition of claim 7.

13. A process for forming a lithographic resist image comprising image-wise exposing to deep UV light of less than about 300 nm a film cast on a substrate and dissolving the exposed portion of said film with a basic solution, wherein the film cast on the substrate comprises a film cast from the castable composition of claim 8.

14. A process for forming a lithographic resist image comprising image-wise exposing to deep UV light of less than about 300 nm a film cast on a substrate and dissolving the exposed portion of said film with a basic solution, wherein the film cast on the substrate comprises a film cast from the castable composition of claim 9.

15. A process for forming a lithographic resist image comprising image-wise exposing to deep UV light of less than about 300 nm a film cast on a substrate and dissolving the exposed portion of said film with a basic solution, wherein the film cast on the substrate comprises a film cast from the castable composition of claim 10.

16. A process for forming a lithographic resist image comprising image-wise exposing to deep UV light of less than about 300 nm a film cast on a substrate and dissolving the exposed portion of said film with a basic solution, wherein the film cast on the substrate comprises a film cast from the castable composition of claim 11.

* * * * *